(12) United States Patent
Zheng et al.

(10) Patent No.: US 9,629,293 B2
(45) Date of Patent: Apr. 18, 2017

(54) CHIP REMOVING DEVICE

(71) Applicants: BOE Technology Group Co., Ltd., Beijing (CN); Beijing BOE Optoelectronics Technology Co., Ltd., Beijing (CN)

(72) Inventors: Zengqiang Zheng, Beijing (CN); Yixiu Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 20 days.

(21) Appl. No.: 14/800,810

(22) Filed: Jul. 16, 2015

(65) Prior Publication Data

US 2016/0095269 A1   Mar. 31, 2016

(30) Foreign Application Priority Data

Sep. 30, 2014   (CN) .......................... 2014 1 0521076

(51) Int. Cl.
*B32B 38/10*   (2006.01)
*H05K 13/04*   (2006.01)
(Continued)

(52) U.S. Cl.
CPC ....... *H05K 13/0491* (2013.01); *B32B 43/006* (2013.01); *G02F 1/13* (2013.01);
(Continued)

(58) Field of Classification Search
CPC ............. B32B 43/006; Y10T 156/1132; Y10T 156/1153; Y10T 156/1168;
(Continued)

(56) References Cited

U.S. PATENT DOCUMENTS 3,443,297 A * 5/1969 Lusby, Jr. .......... H05K 13/0491
                                                    29/239
3,579,795 A * 5/1971 Burman ............. H05K 13/0491
                                                    219/230

(Continued)

FOREIGN PATENT DOCUMENTS

CN   2053831 U   2/1990
CN   2135431 Y   6/1993
(Continued)

OTHER PUBLICATIONS

First Office Action, including Search Report, for Chinese Patent Application No. 21410521076.9, dated Sep. 5, 2016, 8 pages.

*Primary Examiner* — Mark A Osele
(74) *Attorney, Agent, or Firm* — Westman, Champlin & Koehler, P.A.

(57) ABSTRACT

Embodiments of the invention disclose a chip removing device for facilitating the removal of a chip and reducing an influence on the flexible printed circuit board caused by heat, thereby optimizing the manufacturing process of the LCD panel. The chip removing device comprises: a handle; a heat supply unit mounted at one end of the handle, a detachable chip heating head provided on one side of the heat supply unit away from the handle; and a temperature controller in signal communication with the heat supply unit for controlling a temperature output by the heat supply unit.

18 Claims, 3 Drawing Sheets

(51) Int. Cl.
*B32B 43/00* (2006.01)
*G02F 1/13* (2006.01)
*H05K 1/18* (2006.01)
*H05K 3/32* (2006.01)

(52) U.S. Cl.
CPC ............. *H05K 1/189* (2013.01); *H05K 3/323* (2013.01); *H05K 2203/1105* (2013.01); *H05K 2203/176* (2013.01); *Y10S 156/93* (2013.01); *Y10S 156/941* (2013.01); *Y10T 156/1153* (2015.01); *Y10T 156/1168* (2015.01); *Y10T 156/1911* (2015.01); *Y10T 156/1978* (2015.01)

(58) Field of Classification Search
CPC ......... Y10T 156/1179; Y10T 156/1911; Y10T 156/1944; Y10T 156/1978; Y10T 156/1983; Y10S 156/93; Y10S 156/932; Y10S 156/941; Y10S 156/943
See application file for complete search history.

(56) References Cited

U.S. PATENT DOCUMENTS

| | | | | | |
|---|---|---|---|---|---|
| 3,632,973 | A | * | 1/1972 | O'Keefe | B23K 3/047 219/228 |
| 3,699,629 | A | * | 10/1972 | Hood, Jr. | H05K 13/0491 29/278 |
| 3,990,863 | A | * | 11/1976 | Palmer | H05K 13/0491 219/230 |
| 4,637,542 | A | * | 1/1987 | Breske | B23K 3/025 228/180.1 |
| 4,660,281 | A | * | 4/1987 | Omand | H05K 13/0491 29/758 |
| 4,894,910 | A | * | 1/1990 | Reimer | H05K 13/0491 228/234.2 |
| 4,941,700 | A | * | 7/1990 | Lin | H05K 13/0491 29/740 |
| 4,970,779 | A | * | 11/1990 | Chen | B25B 9/00 29/758 |
| 5,072,874 | A | * | 12/1991 | Bertram | H05K 13/0486 228/19 |
| 5,152,448 | A | * | 10/1992 | Williams | H05K 13/0491 219/231 |
| 5,164,037 | A | * | 11/1992 | Iwami | B29C 65/76 156/701 |
| 5,423,931 | A | * | 6/1995 | Inoue | B23K 26/402 156/701 |
| 5,425,833 | A | * | 6/1995 | Fujimoto | H01L 24/799 156/765 |
| 6,156,150 | A | * | 12/2000 | Nishida | H05K 13/0486 156/701 |
| 8,226,796 | B2 | * | 7/2012 | Fan | H01L 21/67144 156/707 |
| 8,556,154 | B2 | * | 10/2013 | Hsieh | H05K 13/0486 228/119 |

FOREIGN PATENT DOCUMENTS

| | | |
|---|---|---|
| CN | 201304531 Y | 9/2009 |
| CN | 102363231 A | 2/2012 |
| CN | 102430830 A | 5/2012 |

* cited by examiner

CHIP REMOVING DEVICE

CROSS-REFERENCE TO RELATED APPLICATION

This application claims the benefit of Chinese Patent Application No. 201410521076.9 filed on Sep. 30, 2014 in the State Intellectual Property Office of China, the whole disclosure of which is incorporated herein by reference.

BACKGROUND OF THE INVENTION

Field of the Invention

The present invention relates to the field of manufacturing technologies of display devices, and specifically, to an integrated circuit (IC) chip removing device.

Description of the Related Art

To reduce production cost, in current small-sized liquid crystal display (LCD) products, LCD panel is usually driven in a chip-on-glass (COG) manner. Instead of a chip driving in a circuit, the chip is now bonded on a glass panel. Specifically, salient points are formed on a bare chip and connected to leads of a LCD screen on the glass panel.

As shown in FIG. 1, which is an illustrative structural view of a LCD panel in prior arts, the LCD panel mainly comprises a glass panel 01, a printed circuit board (PCB) 02, an integrated circuit chip (IC) 03, and the like. Typically, the chip 03 is connected to the glass panel 01 by an anisotropic conductive-adhesive film (ACF) 04 in a COG bonding process, and the PCB 02 is connected to the glass panel 01 through a flexible printed circuit board (FPC) 05, with one end of the flexible printed circuit 05 being connected to the glass panel 04 through an anisotropic conductive-adhesive film 04, and the other end of the flexible printed circuit board 05 is connected to the PCB 02.

Generally, an object has a physical property of expanding upon being heated. During the COG process, when the chip and the glass panel are pressed, a pressing head of high temperature first contacts the chip, and transfers heat to the anisotropic conductive-adhesive film and the glass panel through the chip. At this time, a relative large temperature difference exists between the glass panel and a platform on which the glass panel is placed, which results in a difference in size caused by thermal expansion. After the anisotropic conductive-adhesive film is cured, a relative position between the chip and the glass panel is determined. After the pressing, the chip and the glass panel are cooled down, and a size of the chip is contracted much more than that of the glass panel, which leads to a warping between the chip and the glass panel, and in turn, electrodes are misaligned. In this circumstance, the chip should be bonded again. Before bonding the chip again, the chip should be removed from the glass panel by removing the anisotropic conductive-adhesive film between the chip and the glass panel.

As shown in FIG. 2, which is an illustrative structural view of a chip removing device in prior arts. The chip removing device comprises a full size heating platform 06 and a heating platform base 07. During removing the chip, the glass panel should be positioned on the chip removing device, so that the full size heating platform 06 heats the chip from below of the glass panel. Since the full size heating platform 06 has a relatively large size (nearly covering the entire glass panel), when removing the anisotropic conductive-adhesive film between the chip and the glass panel, an anisotropic conductive-adhesive film between one end of the flexible printed circuit board and the glass panel is also melted down, such that the bonding between the flexible printed circuit board and the glass panel fails. Therefore, the flexible printed circuit board should be bonded again when bonding the chip again, which adds processing steps to the manufacturing of the LCD panel.

SUMMARY OF THE INVENTION

The present invention has been made to overcome or alleviate at least one aspect of the above mentioned disadvantages.

Accordingly, it is an object of the present invention to provide a chip removing device to facilitate the removal of a chip and reduce an influence on the flexible printed circuit board caused by heat, thereby optimizing the manufacturing process of the LCD panel.

According to an aspect of the present invention, there is provided a chip removing device, comprising:

a handle;

a heat supply unit mounted at one end of the handle, a detachable chip heating head provided on one side of the heat supply unit away from the handle; and a temperature controller in signal communication with the heat supply unit for controlling a temperature output by the heat supply unit.

When using the chip removing device according to embodiments of the invention, a user may manipulate the handle with his hand, such that the chip heating head heats the glass panel from above at a region on which the chip is bonded. The temperature controller sends a preset temperature regulating signal to the heat supply unit, such that a corresponding temperature is output by the heat supply unit to the chip heating head. Since the chip heating head is detachable, when selecting the chip heating head, a chip heating head having a width and a length corresponding to a width and a length of a chip to be removed may be selected, with the size differences between the width and the length of the chip heating head and the width and the length of the chip to be removed in a range from about 0 to 0.5 mm, such that only the anisotropic conductive-adhesive film between the chip and the glass panel will be melted and the chip may be separated from the glass panel, but the anisotropic conductive-adhesive film between the flexible printed circuit board and the glass panel will not be influenced or the influence is very small, so that the flexible printed circuit board and the glass panel will not be separated, and thereby the flexible printed circuit board need not be bonded again. Moreover, since the chip heating head is detachable, the chip removing device according to embodiments of the invention may be adapted to remove chips of various sizes.

Therefore, the chip removing device according to embodiments of the present invention can facilitate the removal of a chip and reduce an influence on the flexible printed circuit board caused by heat, thereby optimizing the manufacturing process of the LCD panel.

In some optional embodiments, the chip removing device further comprises a gripping mechanism mounted to the handle for picking a chip to be removed from a glass panel. After the anisotropic conductive-adhesive film between the chip and the glass panel is melted, the gripping mechanism can pick the chip from the glass panel for a bonding process again.

In some optional embodiments, the gripping mechanism comprises:

a operating rod positioned on one side of the handle;

a connecting rod with one end thereof pivotably connected to the operating rod at a first pivoting point and the other end thereof fixedly connected to the handle;

a first griping rod and a second griping rod disposed opposite to each other for griping the chip to be removed, one end of the heat supply unit being pivotably connected to the first griping rod and the other end of the heat supply unit being pivotably connected to the second griping rod, and the two ends of the heat supply unit being positioned at the same height;

a first transmission rod with a first end thereof pivotably connected to the operating rod at a second pivoting point and a second end thereof pivotably connected to a non-griping end of the first griping rod, the second pivoting point being positioned below the first pivoting point; and a second transmission rod with a first end thereof pivotably connected to the operating rod at a third pivoting point and a second end thereof pivotably connected to a non-griping end of the second griping rod, the third pivoting point being positioned above the first pivoting point, wherein, when the operating rod moves towards the handle under a force, a distance between a griping end of the first griping rod and a griping end of the second griping rod decreases so as to grip and pick up the chip to be removed. The distance between the gripping end of the first gripping rod and the gripping end of the second gripping rod can be adjusted by adjusting the distance between the operating rod and the handle, so that the gripping force between the first gripping rod and the second gripping rod can be adjusted.

In some optional embodiments, the first transmission rod is a bent rod, and a vertex of a bending angle of the first transmission rod is orientated towards the handle.

In some optional embodiments, the first transmission rod is a straight rod, and a vertex of an angle formed by the first transmission rod and the operating rod at the pivoting point is orientated towards the handle.

In some optional embodiments, the second transmission rod is a straight rod, and a first end and a second end of the second transmission rod are positioned on different sides of the handle.

In some optional embodiments, a thermal insulation layer is provided between the one end of the handle and the heat supply unit. Since an anisotropic conductive-adhesive film usually has a melting point of about 200° C., the thermal insulation layer may be provided to prevent too high temperature of the handle to be used conveniently by a user.

In some optional embodiments, a thermal insulation coating is provided on an outer surface of the handle at the other end thereof. Since an anisotropic conductive-adhesive film usually has a melting point of about 200° C., the thermal insulation coating may be provided to lower the temperature of the handle so that a user can use the handle conveniently.

In some optional embodiments, a mounting seat is provided on a side of the heat supply unit away from the handle, and the chip heating head is mounted to the mounting seat through a mounting shaft.

In some optional embodiments, both ends of the chip heating head are provided with thermal insulating plates respectively. The thermal insulating plates may further prevent an influence on other materials around the chip by the chip heating head.

BRIEF DESCRIPTION OF THE DRAWINGS

The above and other features of the present invention will become more apparent by describing in detail exemplary embodiments thereof with reference to the accompanying drawings, in which.

Figure 1:
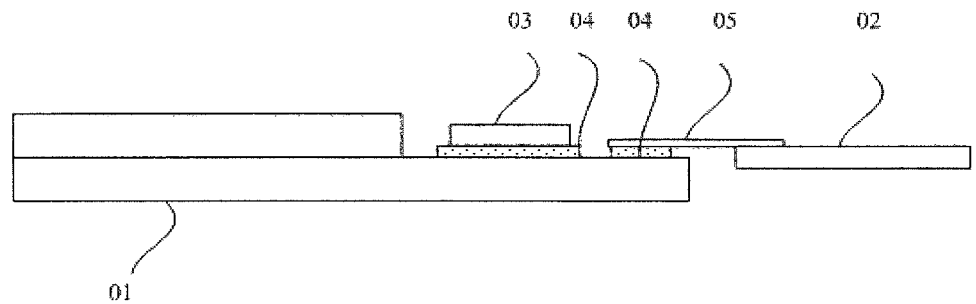
FIG. 1 is an illustrative structural view of a LCD panel in prior arts.
Figure 2:
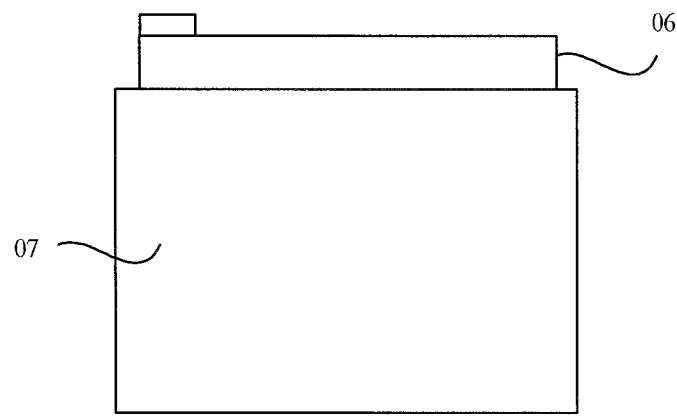
FIG. 2 is an illustrative structural view of a chip removing device in prior arts.

| List of reference numerals: | |
|---|---|
| 01—glass panel | 02—PCB |
| 03—chip | 04—anisotropic conductive-adhesive film |
| 05—flexible printed circuit board | 06—full size heating platform |
| 07—heating platform base | 1—handle |
| 2—heat supply unit | 3—chip heating head |
| 4—temperature controller | 51—operating rod |
| 52—first griping rod | 53—second griping rod |
| 54—first transmission rod | 55—second transmission rod |
| 56—connecting rod | 61—first pivoting point |
| 62—second pivoting point | 63—third pivoting point |
| 7—thermal insulation layer | 8—thermal insulation plate |

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

Figure 3:
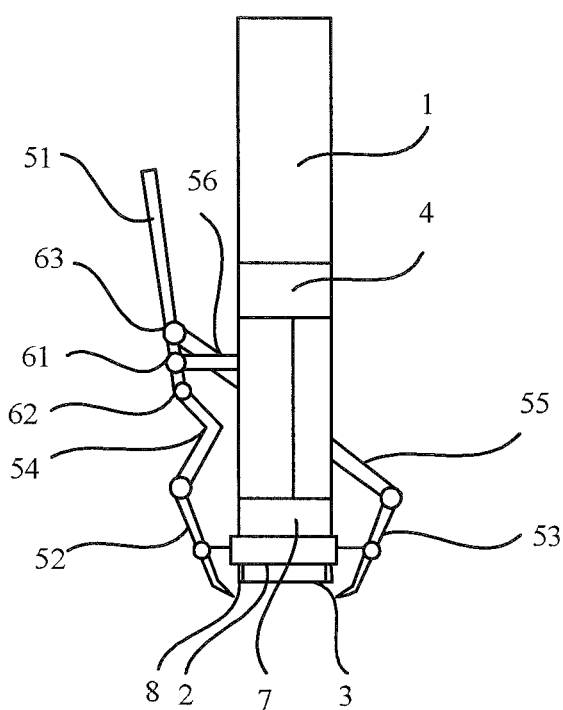
FIG. 3 is an illustrative structural view showing a chip removing device according to an embodiment of the invention.

FIG. 3 is an illustrative structural view showing a chip removing device according to an embodiment of the invention. As shown in FIG. 3, the chip removing device comprises: a handle 1, a heat supply unit 2 mounted at one end of the handle 1, a detachable chip heating head 3 provided on one side of the heat supply unit 2 away from the handle 1, and a temperature controller 4 in signal communication with the heat supply unit 2 for controlling a temperature output by the heat supply unit 2.

When using the chip removing device according to the embodiment of the invention, a user may manipulate the handle 1 with his hand, such that the chip heating head 3 can heat the glass panel from above in a region on which the chip is bonded. The temperature controller 4 sends a preset temperature regulating signal to the heat supply unit 2, such that a corresponding temperature is output by the heat supply unit 2 to the chip heating head 3. Since the chip heating head 3 is detachable, when selecting the chip heating head 3, a chip heating head 3 having a width and a length corresponding to a width and a length of a chip to be removed may be selected, and the size differences between the width and the length of the chip heating head 3 and the width and the length of the chip to be removed may be set in a range from about 0 to 0.5 mm, such that only the anisotropic conductive-adhesive film between the chip and the glass panel will be melted and the chip may be separated from the glass panel, but the anisotropic conductive-adhesive film between the flexible printed circuit board and the glass panel will not be influenced or the influence is very small, so that the flexible printed circuit board and the glass panel will not be separated, and thereby the flexible printed circuit board need not be bonded again. Since the chip heating head is detachable, the chip removing device according to the embodiments of the present invention may be adapted to remove chips of various dimensions.

Therefore, with the chip removing device according to the embodiment of the invention, the chip can be conveniently removed, and an influence on the flexible printed circuit board is reduced, thereby optimizing the manufacturing process of the LCD panel.

Specifically, when selecting the chip heating head 3, the width and the length of the chip heating head 3 are larger than or smaller than the width and the length of the chip to be removed by 0~0.5 mm, respectively.

An anisotropic conductive-adhesive film mainly comprises two parts, resin binder and conductive particles. Besides of providing functions of moisture resistance, bonding, heat resistance and insulation, the resin binder is mainly used to secure a relative position between electrodes of a chip and a glass panel and to provide a pressing force to maintain an area of contact between the electrodes and the conductive particles. An anisotropic conductive-adhesive film is characterized in that resistance characteristic in a Z-axis electrical conducting direction is significantly different from resistance characteristic in a X-Y insulating plane. When a difference between the resistance in the Z-axis electrical conducting direction and the resistance in the X-Y insulating plane has exceeded a certain ratio, the anisotropic conductive-adhesive film has a good anisotropic conductivity. The principle of conduction is that: the conductive particles are used to connect the electrodes between the chip and the glass panel to establish electrical conduction, and at the same time, two adjacent electrodes are prevent from being electrically connected, thereby achieving an aim of establishing a conduction only in the Z-axis electrical conducting direction.

Furthermore, the above chip removing device further comprises: a gripping mechanism mounted to the handle 1 for picking up the chip to be removed from the glass panel. After the anisotropic conductive-adhesive film between the chip and the glass panel is melted, the gripping mechanism can pick up the chip to be removed from the glass panel for a bonding process again.

The above gripping mechanism may have various structures, and one specific embodiment is shown in FIG. 3. As shown in FIG. 3, the gripping mechanism comprises: a operating rod 51 positioned on one side of the handle 1; a connecting rod 56 with one end thereof pivotably connected to the operating rod 51 at a first pivoting point 61 and the other end thereof fixedly connected to the handle 1; a first griping rod 52 and a second griping rod 53 disposed opposite to each other for picking up the chip to be removed, one end of the heat supply unit 2 being pivotably connected to the first griping rod 52 and the other end of the heat supply unit 2 being pivotably connected to the second griping rod 53, and the two ends of the heat supply unit 2 being positioned at the same height; a first transmission rod 54 with a first end thereof pivotably connected to the operating rod 51 at a second pivoting point 62 and a second end thereof pivotably connected to a non-griping end of the first griping rod 52, the second pivoting point 62 being positioned below the first pivoting point 61; a second transmission rod 55 with a first end thereof pivotably connected to the operating rod 51 at a third pivoting point 63 and a second end thereof pivotably connected to a non-griping end of the second griping rod 53, the third pivoting point 63 being positioned above the first pivoting point 61. When the operating rod 51 moves towards the handle 1 under a force, a distance between a griping end of the first griping rod 52 and a griping end of the second griping rod 53 decreases to grip and pick up the chip to be removed. When the chip to be removed needs to be picked up, a user may hold the operating rod 51 and the handle 1 at the same time with his hand(s) and reduce a distance between the operating rod 51 and the handle 1 to adjust the distance between the griping end of the first griping rod 52 and the griping end of the second griping rod 53, and thus adjust a griping force between the first griping rod 52 and the second griping rod 53.

Each of the first transmission rod 54 and the second transmission rod 55 may be formed by one rod or by a plurality of rods pivotably connected together.

According to an alternative embodiment, the first transmission rod 54 is a bent rod, and a vertex of a bending angle of the first transmission rod 54 is orientated towards the handle 1, as shown in FIG. 3.

Figure 4:
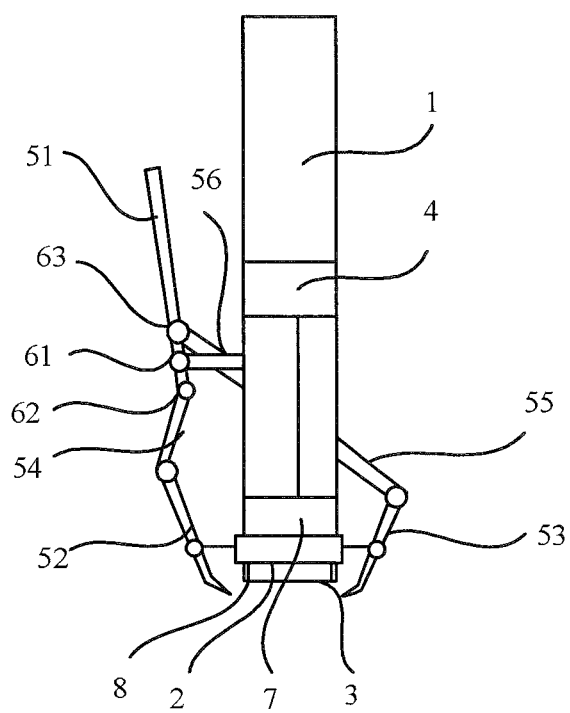
FIG. 4 is an illustrative structural view showing a chip removing device according to another embodiment of the invention.

FIG. 4 is an illustrative structural view showing another structure of a chip removing device according to an embodiment of the invention. As shown in FIG. 4, the first transmission rod 54 is a straight rod, and a first end of the first transmission rod 54 is pivotably connect to the operating rod 51, thereby forming an angle whose vertex is orientated towards the handle 1.

In a specific embodiment, the second transmission rod 55 is a straight rod, a first end and a second end of the second transmission rod 55 are positioned on different sides of the handle 1, and the connecting rod 56 is used to restraint a displacement of the second transmission rod 55 in its length direction.

An anisotropic conductive-adhesive film usually has a melting point of about 200° C. To prevent an overheating of the handle 1 that a user cannot use the handle conveniently, in an embodiment, optionally, a thermal insulation layer 7 is provided between one end of the handle 1 and the heat supply unit 2. Optionally, a thermal insulation coating may also be provided on an outer surface of the handle 1 on the other end of the handle 1. When a user operates the gripping mechanism, he may hold the handle 1 at a portion thereof with the thermal insulation coating. Materials for the thermal insulation layer and the thermal insulation coating can be selected from various kinds of materials, as long as they are not heat-conductive.

The chip heating head 3 may be detachably mounted to the heat supply unit 2 through various different ways. In one specific embodiment, a mounting seat (not shown) is provided on a side of the heat supply unit 2 away from the handle 1, and the chip heating head 3 is mounted to the mounting seat by a mounting shaft. The mounting shaft and the chip heating head may be formed integrally; or the mounting shaft and the chip heating head may be formed separately, and the chip heating head is fitted over the mounting shaft.

In an exemplary embodiment, both ends of the chip heating head 3 are provided with thermal insulating plates 8, respectively. The thermal insulating plate 8 may further prevent an influence on other materials around the chip by the chip heating head 3.

An operating principle of the gripping mechanism according to an embodiment of the invention will be described in detail in connection with FIG. 3 and FIG. 4.

As shown in FIGS. 3 and 4, when a user holds the operating rod 51 and the handle 1 with his hand(s), the operating rod 51 moves towards the handle 1, the operating rod 51 will rotate clockwise around the second pivoting point 62, the first transmission rod 54 will rotate clockwise around the second pivoting point 62, the first griping rod 52 will rotate counter-clockwise around a pivoting point between the first griping rod 52 and one end of the chip heating head 3 (i.e., the griping end of the first griping rod 52 moves towards the handle 1), the second transmission 55 will translate towards the handle 1 and at the same time will rotate clockwise around the third pivoting point 63, the second griping rod 53 will rotate clockwise around a pivoting point between the second griping rod 53 and the other end of the chip heating head 3 (i.e., the griping end of the second griping rod 53 moves towards the handle 1 too), then the first griping rod 52 and the second griping rod 53 can grip and pick up the chip to be removed.

Of course, the operating rod 51 is not limited to the shape shown in the figures, and it could have other shapes. That is to say, the gripping mechanism may have a different configuration consisting of a plurality of rods pivotably connected together, which will be omitted herein.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A chip removing device, comprising:
   a handle;
   a heat supply unit mounted at one end of the handle,
   a detachable chip heating head provided on one side of the heat supply unit away from the handle;
   a temperature controller in signal communication with the heat supply unit for controlling a temperature output by the heat supply unit; and
   a gripping mechanism mounted to the handle for picking up a chip to be removed from a glass panel;
   wherein the gripping mechanism comprises:
   an operating rod positioned on one side of the handle;
   a connecting rod with one end thereof pivotably connected to the operating rod at a first pivoting point and the other end thereof fixedly connected to the handle;
   a first gripping rod and a second gripping rod disposed opposite to each other for gripping the chip to be removed, wherein the first gripping rod is pivotably connected to one end of the heat supply unit and the second gripping rod is pivotably connected to the other end of the heat supply unit, and the two ends of the heat supply unit are positioned at the same height;
   a first transmission rod with a first end thereof pivotably connected to the operating rod at a second pivoting point and a second end thereof pivotably connected to a non-gripping end of the first gripping rod, the second pivoting point being positioned below the first pivoting point; and
   a second transmission rod with a first end thereof pivotably connected to the operating rod at a third pivoting point and a second end thereof pivotably connected to a non-gripping end of the second gripping rod, the third pivoting point being positioned above the first pivoting point,
   wherein, when the operating rod moves towards the handle under a force, a distance between a gripping end of the first gripping rod and a gripping end of the second gripping rod decreases to grip and pick up the chip to be removed.

2. The chip removing device according to claim 1, wherein the first transmission rod is a bent rod, and a vertex of a bending angle of the first transmission rod is orientated towards the handle.

3. The chip removing device according to claim 2, wherein a mounting seat is provided on a side of the heat supply unit away from the handle, and the chip heating head is mounted to the mounting seat through a mounting shaft.

4. The chip removing device according to claim 1, wherein the first transmission rod is a straight rod, and an angle formed between the first transmission rod and the operating rod at the second pivoting point has a vertex orientated towards the handle.

5. The chip removing device according to claim 4, wherein a mounting seat is provided on a side of the heat supply unit away from the handle, and the chip heating head is mounted to the mounting seat through a mounting shaft.

6. The chip removing device according to claim 1, wherein the second transmission rod is a straight rod, and the first end and the second end of the second transmission rod are positioned on different sides of the handle.

7. The chip removing device according to claim 6, wherein a mounting seat is provided on a side of the heat supply unit away from the handle, and the chip heating head is mounted to the mounting seat through a mounting shaft.

8. The chip removing device according to claim 1, wherein a thermal insulation layer is provided between the one end of the handle and the heat supply unit.

9. The chip removing device according to claim 8, wherein a mounting seat is provided on a side of the heat supply unit away from the handle, and the chip heating head is mounted to the mounting seat through a mounting shaft.

10. The chip removing device according to claim 1, wherein a thermal insulation layer is provided between the one end of the handle and the heat supply unit.

11. The chip removing device according to claim 10, wherein a mounting seat is provided on a side of the heat supply unit away from the handle, and the chip heating head is mounted to the mounting seat through a mounting shaft.

12. The chip removing device according to claim 1, wherein a thermal insulation coating is provided on an outer surface of the handle at the other end thereof.

13. The chip removing device according to claim 12, wherein both ends of the chip heating head are provided with thermal insulating plates respectively.

14. The chip removing device according to claim 1, wherein a thermal insulation coating is provided on an outer surface of the handle at the other end thereof.

15. The chip removing device according to claim 1, wherein a mounting seat is provided on a side of the heat supply unit away from the handle, and the chip heating head is mounted to the mounting seat through a mounting shaft.

16. The chip removing device according to claim 1, wherein a mounting seat is provided on a side of the heat supply unit away from the handle, and the chip heating head is mounted to the mounting seat through a mounting shaft.

17. The chip removing device according to claim 1, wherein a mounting seat is provided on a side of the heat supply unit away from the handle, and the chip heating head is mounted to the mounting seat through a mounting shaft.

18. The chip removing device according to claim 1, wherein both ends of the chip heating head are provided with thermal insulating plates respectively.

* * * * *